United States Patent
Suquet

(10) Patent No.: US 7,282,904 B2
(45) Date of Patent: Oct. 16, 2007

(54) DEVICE FOR MEASURING THE INTENSITY OF A STRONG CURRENT PASSING THROUGH A WIRE

(75) Inventor: Michel Suquet, Villeneuve Tolosane (FR)

(73) Assignee: Siemens VDO Automotive, Toulouse Cedex 1 (FR)

( * ) Notice: Subject to any disclaimer, the term of this patent is extended or adjusted under 35 U.S.C. 154(b) by 0 days.

(21) Appl. No.: 10/568,435

(22) PCT Filed: Aug. 11, 2004

(86) PCT No.: PCT/EP2004/008981

§ 371 (c)(1),
(2), (4) Date: Feb. 14, 2006

(87) PCT Pub. No.: WO2005/022173

PCT Pub. Date: Mar. 10, 2005

(65) Prior Publication Data

US 2006/0244437 A1    Nov. 2, 2006

(30) Foreign Application Priority Data

Aug. 22, 2003 (FR) .................................. 03 10120

(51) Int. Cl.
*G01R 15/18* (2006.01)

(52) U.S. Cl. ............................. 324/117 R; 324/117 H; 324/126; 324/127

(58) Field of Classification Search ............ 324/117 R, 324/117 H, 126, 127
See application file for complete search history.

(56) References Cited

U.S. PATENT DOCUMENTS

| | | | | | |
|---|---|---|---|---|---|
| 2,175,046 | A | * | 10/1939 | Warner | 324/117 R |
| 2,958,036 | A | * | 10/1960 | Gilbert | 323/362 |
| 4,324,255 | A | * | 4/1982 | Barach et al. | 600/300 |
| 4,897,600 | A | * | 1/1990 | Hagmann et al. | 324/127 |
| 5,103,164 | A | * | 4/1992 | Kawaguchi et al. | 324/117 R |
| 5,206,596 | A | * | 4/1993 | Beihoff et al. | 324/536 |
| 5,473,244 | A | * | 12/1995 | Libove et al. | 324/126 |
| 5,825,175 | A | * | 10/1998 | Selcuk | 324/117 H |
| 6,184,672 | B1 | * | 2/2001 | Berkcan | 324/117 R |
| 6,566,854 | B1 | * | 5/2003 | Hagmann et al. | 324/117 R |
| 6,614,218 | B1 | * | 9/2003 | Ray | 324/117 R |

FOREIGN PATENT DOCUMENTS

| | | |
|---|---|---|
| EP | 0 580 473 | 1/1994 |
| WO | WO99/01773 | 1/1999 |
| WO | WO 02/071081 | 9/2002 |

* cited by examiner

*Primary Examiner*—Ha Tran Nguyen
*Assistant Examiner*—Arleen M. Vazquez
(74) *Attorney, Agent, or Firm*—Young & Thompson

(57) ABSTRACT

The device for measuring the intensity (1) of a strong current passing through a wire (1) comprises a magnetic sensor (2) in the form of a loop surrounding the wire (1), and a turn (3) of conductive material surrounding the wire (1) conducting a high-frequency counter-current, the intensity of which is adjusted to cancel the magnetic field (H) is characterized in that the turn (3) of conductive material is in short circuit and surrounds the magnetic sensor (2).

5 Claims, 1 Drawing Sheet

DEVICE FOR MEASURING THE INTENSITY OF A STRONG CURRENT PASSING THROUGH A WIRE

BACKGROUND OF THE INVENTION

The present invention relates to a device for measuring the intensity of a strong current passing through a wire.

The term "strong current" is used to mean any current with an intensity between 100 and 1000 A.

To measure such strong currents, it is normally the magnetic field generated around the wire conducting the current that is measured.

To obtain an accurate measurement of this magnetic field, a so-called "opposition" method is used.

This method consists in placing around the wire a winding conducting a current counter to the direction of the magnetic field, that is adjusted to cancel the magnetic field.

When the counter-current control loop is a system said to be sampled at a frequency F0, the components having frequencies greater than the frequency F0 that are present in the current to be measured can create serious errors.

SUMMARY OF THE INVENTION

The purpose of the present invention is to create a device for measuring the intensity of a strong current which can filter the abovementioned spurious components in order to obtain an accurate measurement of the intensity.

The subject of the invention is thus a device for measuring the intensity of a strong current passing through a wire, comprising a magnetic sensor in the form of a loop surrounding the wire, and a turn of conductive material surrounding the wire, conducting a high-frequency counter-current, the intensity of which is adjusted to cancel the magnetic field.

According to the invention, this device is characterized in that the turn of conductive material is in short circuit and surrounds the magnetic sensor.

The turn of conductive material in short circuit is a closed turn.

The resistance R of the turn of conductive material in short circuit is adjusted to obtain an L/R filtering constant, L being the inductance of the turn.

This turn in short circuit conducting a high-frequency counter-current, thus forms a filter that can filter the spurious components of the current to be measured.

Preferably, the turn is made of soft iron and is surrounded externally by a copper jacket.

Such a turn also acts as a shield against the electromagnetic fields external to the device.

In a preferred embodiment of the invention, the turn includes, internally, a channel concentric with the torus of the turn, containing the magnetic sensor.

The magnetic sensor can be a wire of nickel-iron alloy forming a closed loop and surrounded around its entire circumference by a coil that is formed by helical turns.

The measuring device according to the invention thus comprises a single component which incorporates the turn and the magnetic circuit.

Other features and advantages of the invention will become apparent from the description below.

BRIEF DESCRIPTION OF THE DRAWINGS

In the appended drawings, given by way of non-limiting examples.

DESCRIPTION OF THE PREFERRED EMBODIMENTS

Figure 1:
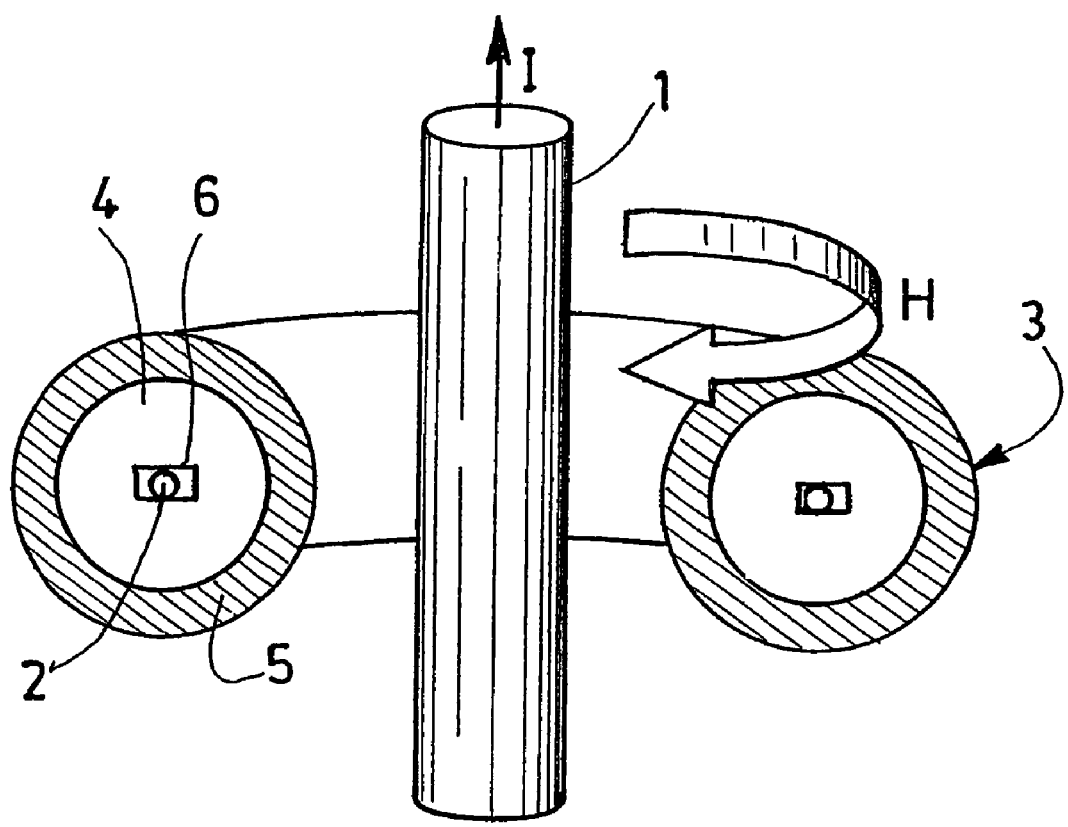
FIG. 1 shows, in partial cross section, a current measuring device according to the invention, in which the turn and the magnetic circuit are incorporated in a single component.

The device represented in FIG. 1 for measuring the intensity I of a strong current passing through a wire 1, comprises a magnetic sensor 2 in the form of a loop surrounding the wire 1, a turn 3 of conductive material surrounding the wire, conducting a high-frequency counter-current, the intensity of which is adjusted to cancel the magnetic field H.

According to the invention, the turn 3 of conductive material is closed and therefore in short circuit, and it surrounds the magnetic sensor 2.

The resistance R of the turn 3 of conductive material in short circuit is adjusted so as to obtain an L/R filtering constant, L being the inductance of the turn 3.

In the example shown, the turn 3 is made of soft iron 4 and is surrounded externally by a copper jacket 5.

Figure 2:
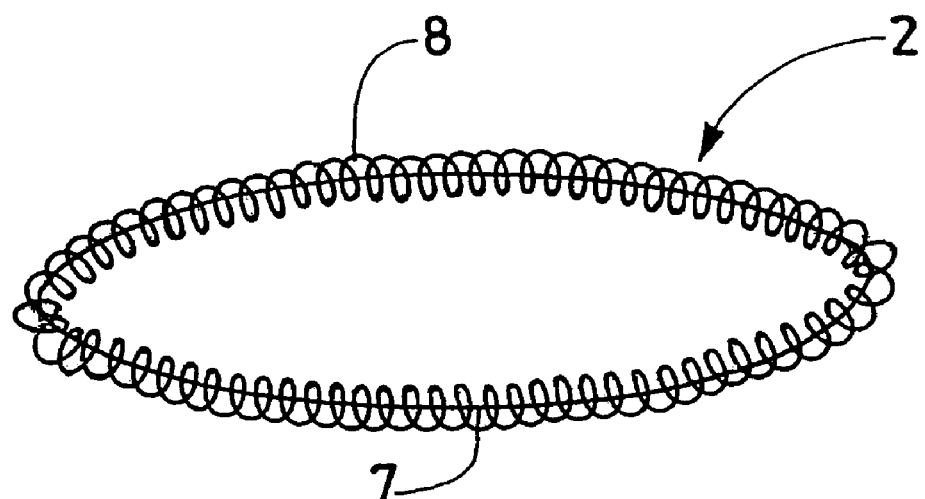
FIG. 2 shows the magnetic sensor which is also incorporated in the component shown in FIG. 1.

As indicated in FIG. 1, the turn 3 includes, internally, a channel 6 that is concentric with the torus of the turn 3, containing the magnetic sensor 2 represented in detail in FIG. 2.

FIG. 2 shows that the magnetic sensor 2 is a wire 7 of nickel-iron alloy (Mumetal) forming a closed loop and surrounded around its entire circumference by a coil 8 formed by helical turns.

The measuring device that has just been described can, for example, present the following characteristics:

| | |
|---|---|
| wire diameter (without insulation): | 4 mm |
| nature of the wire 1: | copper |
| internal diameter of the toroidal turn 3: | 15 mm |
| outer diameter of the turn 3: | 45 mm |
| thickness of the copper jacket 5: | 2 mm |
| width of the channel 6: | 5 mm |

There now follows a description of the operation of the measuring device that has just been described.

The current of intensity I passing through the wire 1 generates a magnetic field H around this wire.

The turn 3 in short circuit surrounding the wire conducts a high-frequency counter-current (for example 10 Hz), the effect of which is to generate a magnetic field in a direction opposite to the field H so as to cancel the latter.

The magnetic sensor 2 incorporated in the turn 3 is used to measure the magnetic field and therefore detect the nullity of this field. The value of the intensity I is obtained by measuring the intensity of the counter-current.

The turn 3 made of a soft-iron core 4 and an external copper jacket 5 presents a resistance R and an inductance L that can be adjusted by construction to obtain the required L/R filtering constant.

The turn 3 in short circuit is thus used to filter the spurious frequencies by adjusting the cut-off frequency F1 of the filter by altering the dimensioning of the elements 4 and 5. The frequency F1 is chosen between the required bandwidth of the sensor (10 Hz for example) and the sampling frequency F0 (10 kHz for example).

The high-frequency components that are not reduced by the compensating current no longer saturate the measurement subsystem. The detrimental phase lag due to a magnetic signal filter is eliminated. The anti-aliasing low-pass filter is outside the control loop.

The invention claimed is:

1. A device for measuring the intensity (I) of a strong current passing through a wire (1), comprising a magnetic sensor (2) in the form of a loop surrounding the wire (1), and a turn (3) of conductive material surrounding the wire (1), conducting a high-frequency counter-current, the intensity of which cancels the magnetic field (H), wherein the turn (3) of conductive material is in short circuit and surrounds the magnetic sensor (2), wherein the turn (3) of conductive material in short circuit is a closed turn, and wherein a resistance R and an inductance L of the turn (3) of conductive material define an L/R filtering constant of the turn of conductive material with which the turn of conductive material filters components of the current passing through the wire.

2. A device for measuring the intensity (I) of a strong current passing through a wire (1), comprising:

a magnetic sensor (2) in the form of a loop surrounding the wire (1); and a filter for the magnetic sensor that includes a turn (3) of conductive material surrounding the wire (1) and conducting a high-frequency counter-current, the intensity of which cancels the magnetic field (H), the turn (3) of conductive material being in short circuit and surrounding the magnetic sensor (2), wherein a resistance R and an inductance L of the turn (3) of conductive material define an L/R filtering constant of the turn of conductive material with which the turn of conductive material filters components of the current passing through the wire.

3. The device as claimed in claim 2, characterized in that the turn (3) is made of soft iron (4).

4. The device as claimed in claim 2, characterized in that the turn (3) includes, internally, a channel (6) concentric with the torus of the turn, containing the magnetic sensor (2).

5. A device for measuring the intensity (I) of a strong current passing through a wire (1), comprising:

a magnetic sensor (2) comprising a first wire (7) forming a closed loop whose entire circumference is surrounded by coils of a coiled second wire (8), the magnetic sensor extending completely around a wire (1) whose current is being measured;

a turn (3) of conductive material that is a loop in short circuit and extending completely around the wire (1) whose current is being measured, said turn having an internal annular channel in which said magnetic sensor is housed, said turn conducting a high-frequency counter-current, the intensity of which cancels the magnetic field (H) created by the current in the wire whose current is being measured, wherein said turn is a filter that filters components of the current passing through the wire and wherein a resistance R and an inductance L of the turn define an L/R filtering constant of the filter.

* * * * *